United States Patent
Madan et al.

(10) Patent No.: US 7,630,257 B2
(45) Date of Patent: Dec. 8, 2009

(54) METHODS AND SYSTEMS FOR ACCESSING MEMORY

(75) Inventors: Sudhir Kumar Madan, Richardson, TX (US); Hugh P. Mcadams, McKinney, TX (US); Sung-Wei Lin, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 102 days.

(21) Appl. No.: 11/543,338

(22) Filed: Oct. 4, 2006

(65) Prior Publication Data

US 2008/0084773 A1 Apr. 10, 2008

(51) Int. Cl.
*G11C 7/00* (2006.01)
(52) U.S. Cl. .................................. 365/190; 365/205
(58) Field of Classification Search ................. 365/190, 365/205
See application file for complete search history.

(56) References Cited

U.S. PATENT DOCUMENTS

| | | | |
|---|---|---|---|
| 5,438,543 A * | 8/1995 | Yoon ..................... | 365/189.11 |
| 6,373,753 B1 * | 4/2002 | Proebsting ............. | 365/189.09 |
| 6,445,621 B1 * | 9/2002 | Heightley .............. | 365/189.11 |
| 6,757,206 B2 | 6/2004 | McAdams et al. | |
| 2001/0010642 A1 * | 8/2001 | Naffziger et al. ........... | 365/154 |
| 2004/0266028 A1 * | 12/2004 | Rodriguez et al. ............. | 438/3 |
| 2005/0018466 A1 * | 1/2005 | Kurth et al. ................... | 365/94 |
| 2005/0036367 A1 * | 2/2005 | Merritt et al. ......... | 365/185.05 |
| 2005/0063225 A1 * | 3/2005 | Takashima .................. | 365/199 |
| 2005/0254282 A1 * | 11/2005 | Summerfelt et al. ........ | 365/145 |
| 2005/0276089 A1 * | 12/2005 | Madan et al. ................ | 365/100 |
| 2006/0082478 A1 * | 4/2006 | Keeth et al. .................. | 341/101 |
| 2006/0133129 A1 * | 6/2006 | Rodriguez et al. .......... | 365/145 |
| 2006/0146588 A1 * | 7/2006 | Rodriguez et al. .......... | 365/145 |
| 2006/0146590 A1 | 7/2006 | Fukushi et al. | |
| 2007/0036012 A1 * | 2/2007 | Madan et al. ................ | 365/203 |

OTHER PUBLICATIONS

"An 8Mb 1T1C Ferroelectric Memory with Zero Cancellation and Micro-Granularity Redundancy", Jarrod Eliason, Sudhir Madan, Hugh McAdams, Glen Fox, Ted Moise, Changgui Lin, Kurt Schwartz, Jim Gallia, Edwin Jabillo, Bill Kraus and Scott Summerfelt, IEEE Journal of Solid State Physica, vol. 39, No. 4, Apr. 2004, 4 pgs.

"A 64-Mb Embedded FRAM Utilizing a 130-nm 5LM Cu/FSG Logic Process", Hugh P. McAdams, Randy Acklin, Terry Blake, Xiao-Hong Du, Jarrod Eliason, John Fong, William F. Kraus, David Liu, Sudhir Madan, Ted Moise, Sreedhar Natarajan, Ning Qian, Yunchen Qiu, Keith A Remack, John Rodriguez, John Roscher, Anand Seshadri and Scott R. Summerfelt, IEEE Journal of Solid-State Circuits, vol. 39, No. 4, Apr. 2004, 11 pgs.

(Continued)

*Primary Examiner*—Michael T Tran
(74) *Attorney, Agent, or Firm*—Wade J. Brady, III; Frederick J. Telecky, Jr.

(57) ABSTRACT

One aspect of the invention relates to a method for accessing a memory device. One embodiment relates to a method for accessing a memory device. In the method during a read operation, one data value is provided on a local IO line while complimentary local IO line that is associated with the local IO line is inactivated. During a write operation, another data value is provided on the local IO line and a complimentary data value is provided on the complimentary local IO line. Other systems and methods are also disclosed.

8 Claims, 12 Drawing Sheets

OTHER PUBLICATIONS

"A Current-Based Reference-Generation Scheme for 1T-1C Ferroelectric Random-Access Memories", Joseph Wai Kit Siu, Yadollah Eslami, Ali Sheikholeslami, P. Glenn Gulak Toru Endo and Shoichiro Kawashima, IEEE Journal of Solid-Stage Circuits, vol. 38, No. 3, Mar. 2003,9 pgs.

* cited by examiner

METHODS AND SYSTEMS FOR ACCESSING MEMORY

FIELD OF INVENTION

The present invention relates generally to semiconductor memory devices and more particularly to improved apparatus and methods for coupling local IO lines with sense amplifiers and global IO lines for accessing memory cells in memory devices.

BACKGROUND OF THE INVENTION

Ferroelectric memory devices, like other semiconductor memories, are used for storing data and/or program code in personal computer systems, embedded processor-based systems, and the like. Ferroelectric memories are commonly organized in single-transistor, single-capacitor (1T1C) or two-transistor, two-capacitor (2T2C) cell configurations, in which data is read from or written to the device using address signals and various other control signals. The individual memory cells typically include one or more ferroelectric (FE) capacitors adapted to store a binary data bit, as well as one or more access transistors, typically MOS devices, operable to selectively connect the FE capacitor to one of a pair of complimentary bitlines, with the other bitline being connected to a reference voltage.

The ferroelectric memory cells are commonly organized as individual bits of a corresponding data word, wherein the cells of a given word are accessed concurrently through activation of platelines and wordlines by address decoding circuitry. Such devices are typically organized internally into blocks, sections, segments, rows and columns. For example, a 6M device may include 2 blocks of 3M each, the blocks each consisting of 6 sections which contain 16 segments, Each segment contains 512 words or rows of 64 bits or columns per word. When a data word is read, the cell data from the corresponding bit in each of the 64 columns is sensed using 64 individual sense amplifiers associated with the individual data cell columns.

Data in a ferroelectric data cell is read by connecting the cell capacitor on a first bitline and a reference voltage on a complementary bitline to the input terminals of a differential sense amp. The plateline of the accessed cell is then pulsed. This provides a differential voltage on the bitline pair, which is connected to a sense amp circuit. The reference voltage is typically supplied at an intermediate voltage between a voltage ($V_{"0"}$) associated with a capacitor charged to a binary "0" and that of the capacitor charged to a binary "1" ($V_{"1"}$). The resulting differential voltage at the sense amp terminals represents the data stored in the cell, which is amplified and applied to a pair of local IO lines. The transfer of data between the ferroelectric memory cell, the sense amp circuit, and the local IO lines is controlled by various access transistors, typically MOS devices, with switching signals being provided by control circuitry in the device.

In a typical ferroelectric memory read sequence, two sense amp terminals or bitlines are initially equalized to ground, and then floated, after which a target ferroelectric memory cell is connected to one of the sense amp terminals via the bitline to which the cell is connected. Thereafter, a reference voltage is connected to the remaining sense amp terminal, and the sense amp senses the differential voltage across the terminals and latches a voltage indicative of whether the target cell was programmed to a binary "0" or to a "1". The sense amp terminals are then coupled to complimentary local IO lines, which were previously precharged to a predetermined voltage state, such as VDD. The sense amp drives one of the local IO lines to a different voltage state, by which the read data state is passed to an IO buffer circuit. In a write operation, the sense amp and bitline terminals are connected to the local IO lines, which are driven to opposite voltage states depending on the data to be written. One bitline connects to the ferroelectric memory cell for storage of the data written into the ferroelectric capacitor.

Figure 1A:
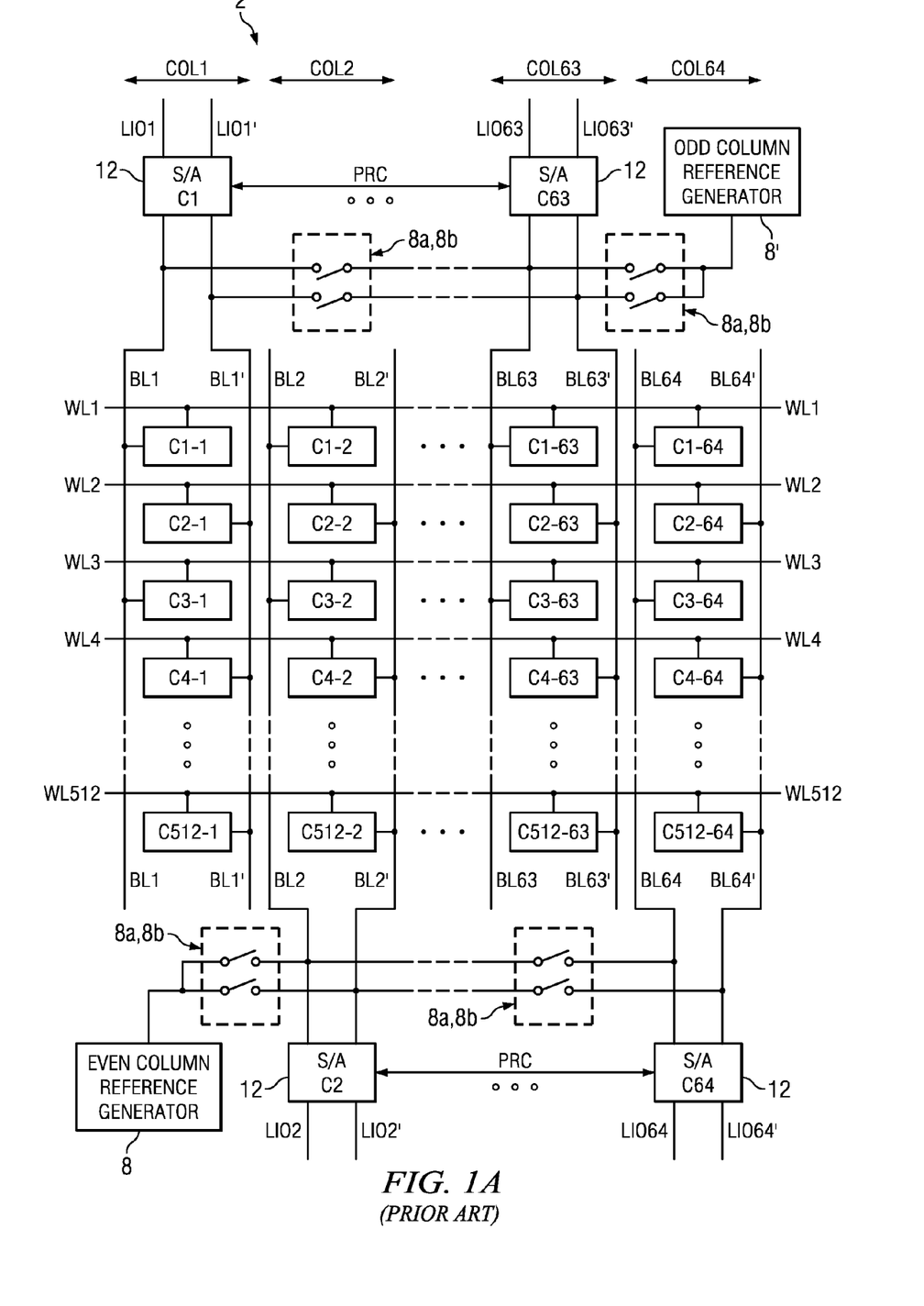
FIGS. 1A-1B are schematic diagrams illustrating a folded bitline ferroelectric memory device having a conventional sense amp and associated circuitry.
Figure 1B:
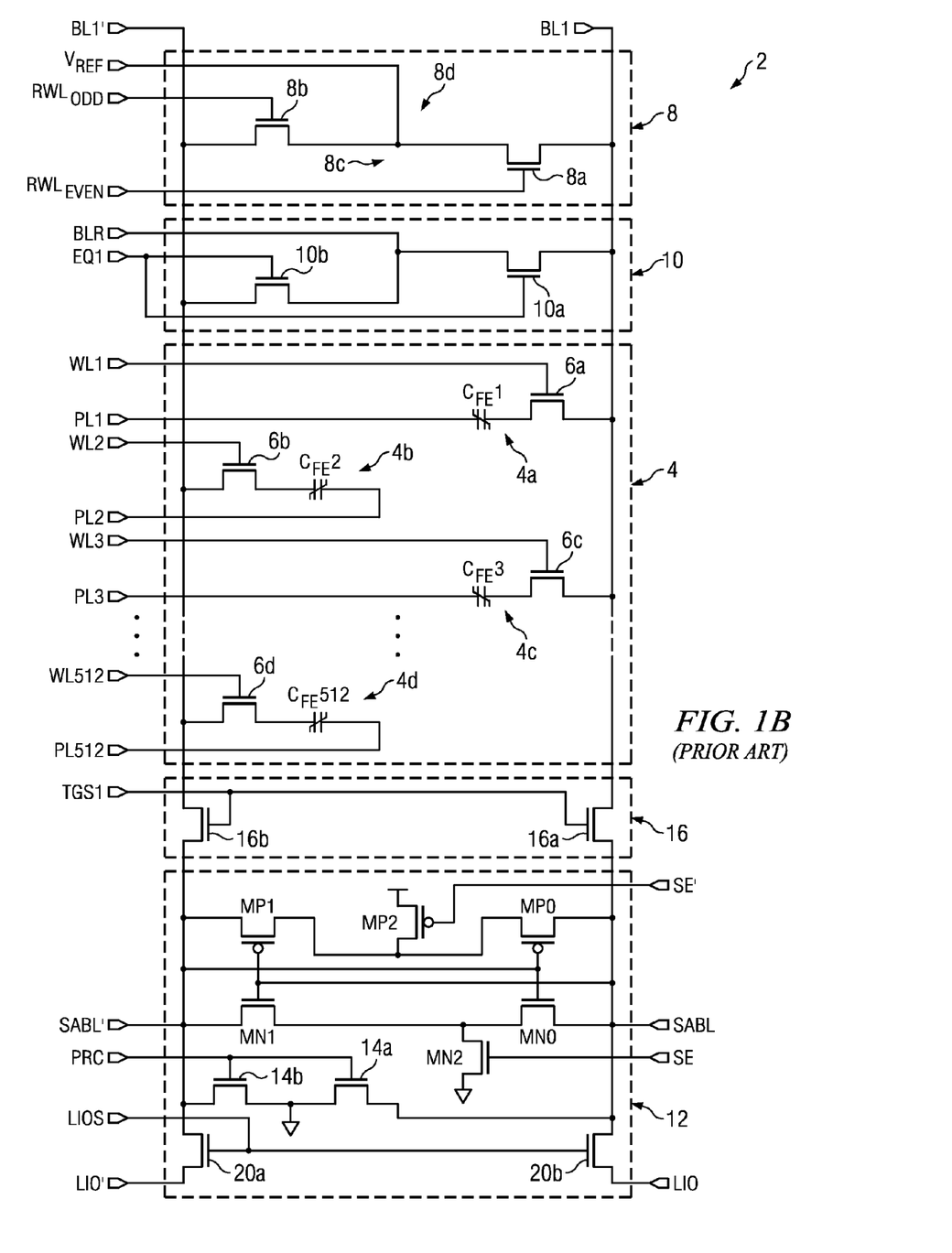

FIGS. 1A and 1B illustrate a ferroelectric memory device 2 organized in a folded bitline architecture, wherein a segment portion of the device 2 has 512 rows (words) and 64 columns (bits) of data storage cells $C_{ROW-COLUMN}$, where each column of cells is accessed via a pair of complimentary data bitlines $BL_{COLUMN}$ and $BL_{COLUMN}'$. One column of the device 2 is illustrated in FIG. 1B, in which cells C1-1 through C1-64 form a data word accessible via a wordline WL1 and complimentary bitline pairs BL1/BL1' through BL64/BL64'. The cell data is sensed during data read operations using sense amp circuits 12 (S/A C1 through S/A C64) associated with columns 1 through 64, respectively. In a typical folded bitline architecture ferroelectric memory device, the cells $C_{ROW-COLUMN}$ individually include one or more ferroelectric cell capacitors and one or more access transistors to connect the cell capacitors between one of the complimentary bitlines associated with the cell column and a plateline, where the other bitline is selectively connected to a reference voltage.

In the device 2, the sense amps 12 associated with even numbered columns are located at the bottom of the segment, whereas sense amps 12 associated with odd numbered columns are located at the top of the segment. Shared reference generators 8' and 8 are provided at the top and bottom of the segment columns, respectively. An even column reference generator 8 is provided at the bottom of the segment columns for providing a reference voltage for even numbered columns and an odd column reference generator 8' is provided at the top of the columns for the odd numbered columns. The reference voltages from the generators 8, 8' are coupled to one of the bitlines in the columns using one of a pair of switches 8a, 8b, depending upon whether an even or odd numbered wordline is selected. In reading the first data word of the illustrated segment along the wordline WL1 in the device 2, the cells C1-1 through C1-64 are connected to the sense bitlines BL1, BL2 . . . , BL63, and BL64 while the complimentary reference bitlines BL1', BL2' . . . , BL63', and BL64' are floating. The reference bitlines BL1', BL2', . . . , BL63', and BL64' are thereafter connected to the reference voltage generators 8, 8'.

As illustrated in FIG. 1B, the ferroelectric memory cells 4 include capacitors (e.g., $C_{FE}1$, $C_{FE}2$, . . . , $C_{FE}512$) constructed with ferroelectric dielectric material which may be polarized in one direction or another in order to store a binary value. The ferroelectric effect allows for the retention of a stable polarization in the absence of an applied electric field due to the alignment of internal dipoles within Perovskite crystals in the dielectric material. This alignment may be selectively achieved by application of an electric field to the ferroelectric capacitor $C_{FE}$ in excess of the coercive field of the material. Conversely, reversal of the applied field reverses the internal dipoles.

In ferroelectric memories, as well as conventional DRAMs, local IO lines LIO/LIO' are coupled to the sense amp terminals SABL/SABL' at appropriate times. To conserve chip area, these local IO lines often run parallel to one another and are separated from one another by only a small space. For example LIO lines associated with columns m and n are typically physically placed in the order such as LIOm, LIOm', LIOn, and LIOn'. As technology improves and feature sizes become smaller, adjacent local IO lines (LIOm and LIOm', and LIOm' and LIOn, and LIOn and LIOn') get closer together. This close spacing can result in significant amount of capacitance coupling between adjacent IO lines that can lead to a significant degradation of signal noise margins.

For example, in a typical device the local IO lines LIO/LIO' are pre-charged to VDD and are coupled to the sense amp terminals SABL/SABL' using n-channel transistors 20*a*, 20*b*. If two adjacent memory cells associated with columns m and n store a zero, the two pairs of local IO lines LIOm/LIOm' and LIOn/LIOn associated therewith will have LIOm and LIOn pulled low because a low voltage is stored in the associated two pairs of sense amp terminals. The line to line capacitive coupling between LIOm and LIOm', and LIOm' and LIOn will also pull the LIOm' low. Calculations show that when the LIO/LIO' pair discharge, the capacitance coupling could reduce the differential signal on complimentary local IO lines. (In the above example the signal difference between LIOm and LIOm' will be significantly reduced because the LIOm' is pulled low due to capacitive coupling from LIOm and LIOn). In addition, the reduced differential signal on LIO pair may slow down the response time when this differential analog signal is converted back to a digital signal.

In order to reduce coupling between the local IO lines during a read, shield lines could be inserted between local IO pairs and or adjacent pairs. However, due to limited space between the local IO lines, insertion of such lines may be difficult. In addition, if shielded local IO lines were added, such lines would increase total line capacitance and thereby undesirably increase memory access times.

Therefore, there is a need for improved methods and systems for transferring data between sense amps and local IO lines, and further transferring data between local IO lines and global IO lines.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

One embodiment relates to a method for accessing a memory device. In the method during a read operation, one data value is provided on a local IO line while complimentary local IO line that is associated with the local IO line is inactivated. During a write operation, another data value is provided on the local IO line and a complimentary data value is provided on the complimentary local IO line.

Thus, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

The present invention will now be described with reference to the attached drawings, wherein like reference numerals are used to refer to like elements throughout. Further, the exemplary implementation can also include features discussed with respect to the prior art system described with reference to FIG. 1A-1B.

Figure 2A:
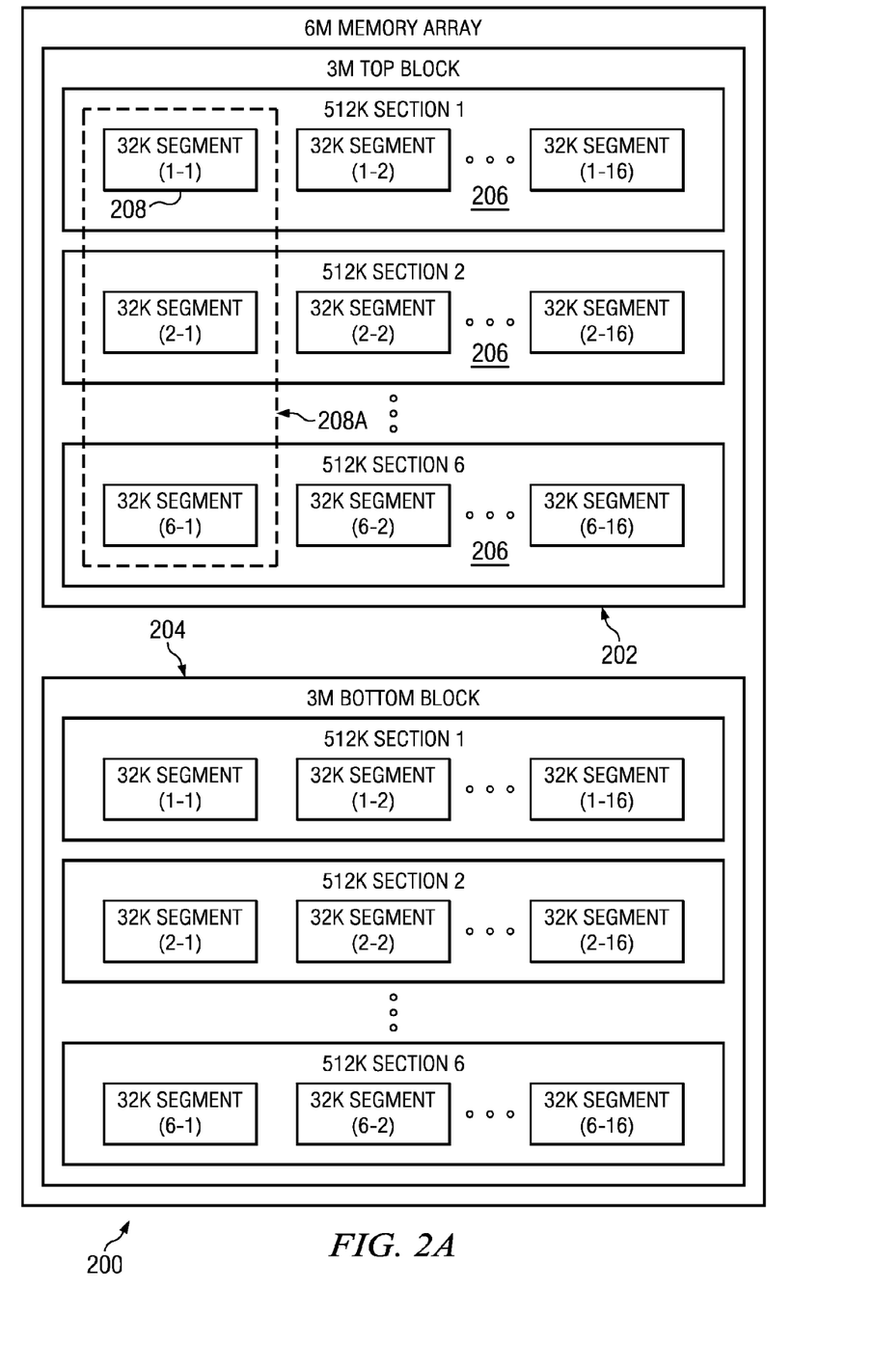
FIGS. 2A-2D are schematic diagrams illustrating aspects of one memory device.

One exemplary implementation of the invention is illustrated in FIGS. 2A-2F, in a folded-bitline architecture ferroelectric memory device 200 comprising one or more data cell columns of 512 1T1C ferroelectric (FE) memory cells 218. As shown in FIG. 2A, one exemplary device 200 relates to a 6M ferroelectric memory array that includes a 3M top block 202 and 3M bottom block 204, each of which includes six 512K memory sections 206. Each memory section 206 is further divided into sixteen segments 208 of 32 k each. Each segment may include, for example 512 rows of memory cells (words) and 64 columns (bits) of memory cells. In one embodiment, the segments vertically aligned with one another (e.g., segment (1-1), segment (2-1), . . . , segment (6-1)) may also be referred to as a segment 208A. Although the invention is discussed with reference to this particular memory arrangement, the invention is applicable to ferroelectric memories as well as other types of memories. In other various embodiments, the memory array may be larger or smaller and need not be divided into blocks, sections, or segments, and may include other groupings of memory cells or hierarchies related thereto.

Figure 2B:
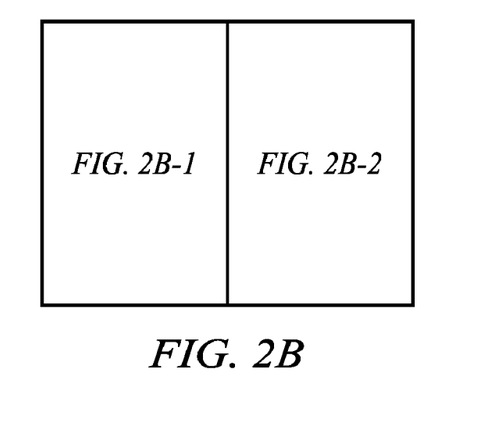
Figure 2B:
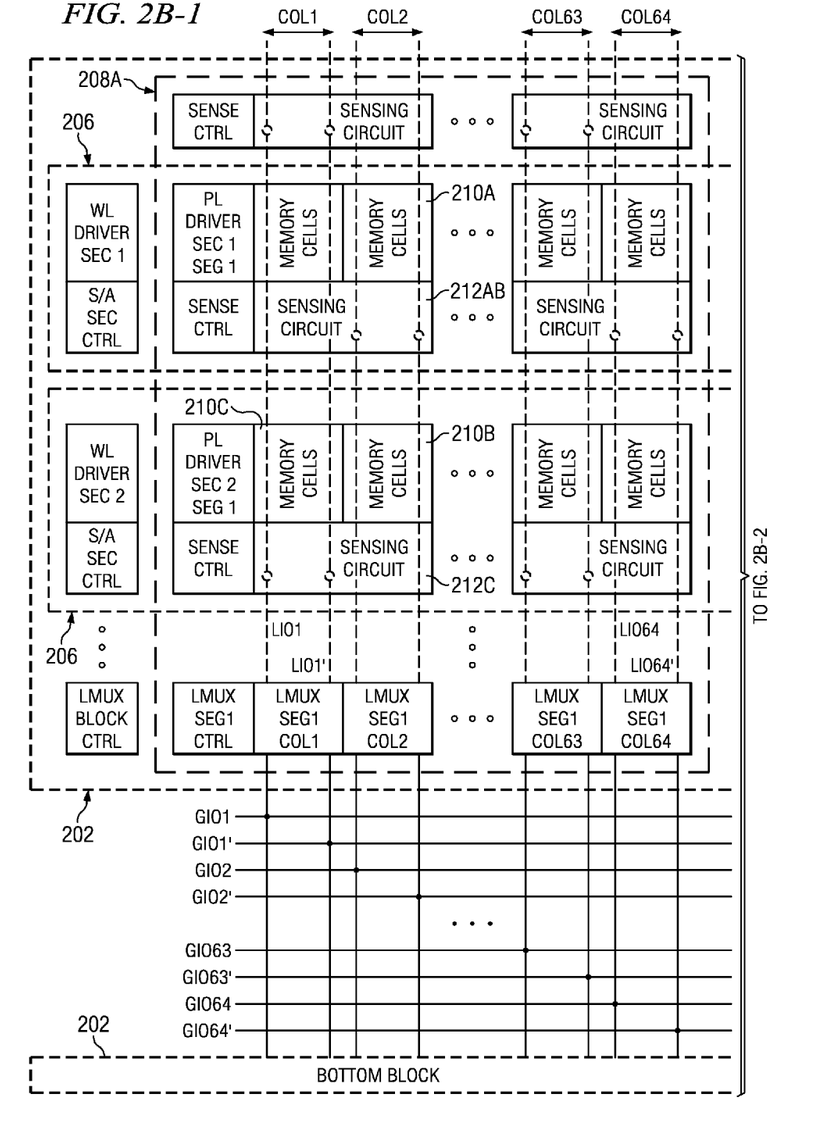
FIGS. 2E-2F are timing diagrams relating to the memory device of FIGS. 2A-2D.
Figure 2B:
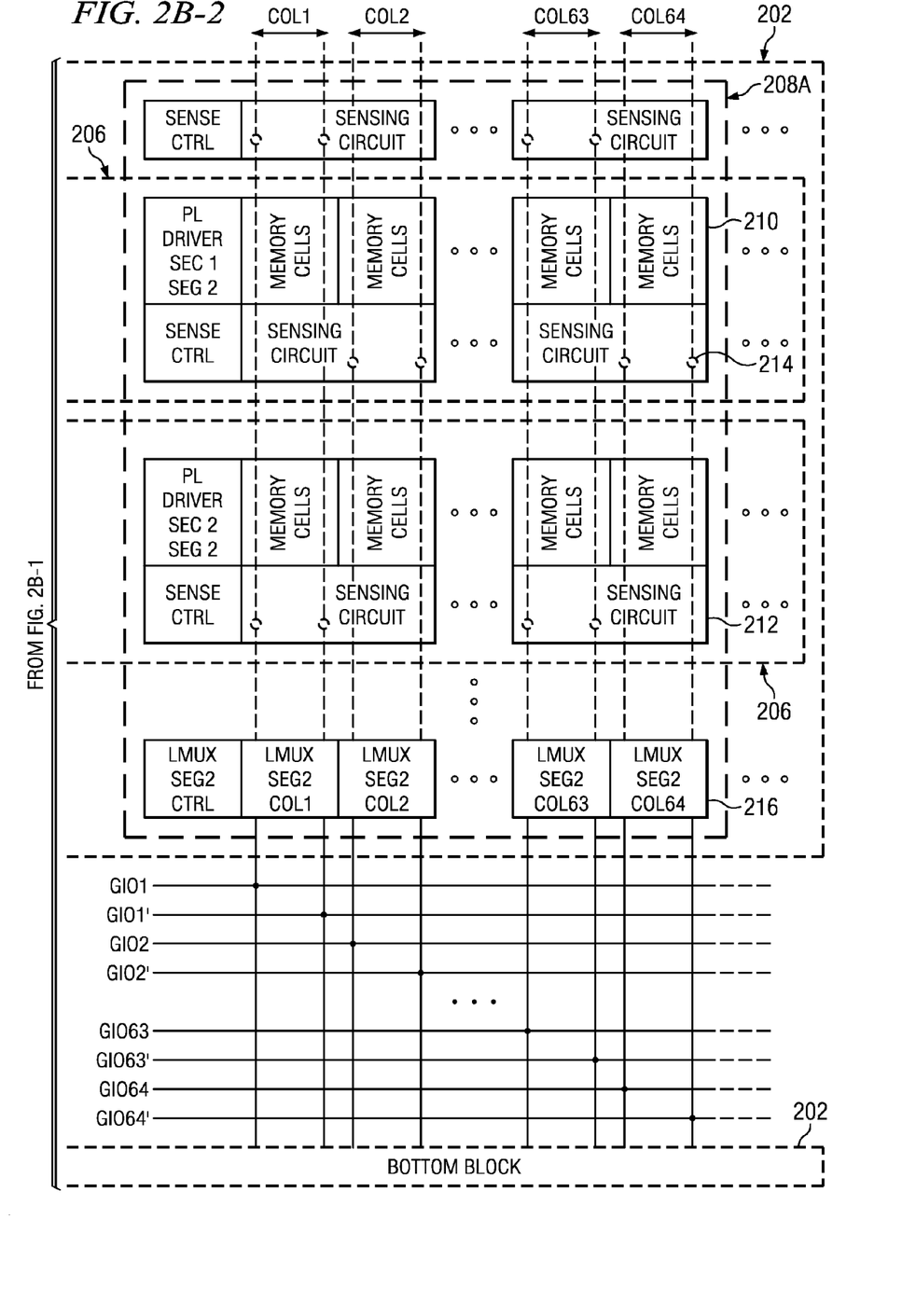

As shown in FIG. 2B, each group of memory cells 210 can share a sensing circuit 212 that is positioned between itself and a group of memory cells in an adjacent section 206. For example, the groups of memory cells 210A and 210B share the sensing circuit 212AB. Similarly, the group of memory cells 210C and the group of memory cells in Col. 1, Section 3, Segment 1 (not shown), share the sensing circuit 212C. Thus, the sensing circuits 212 associated with even numbered columns are coupled to the bottom of every other section associated with that column of memory cells, whereas sensing circuits 212 associated with odd numbered columns are coupled to the top of every other section associated with that column of memory cells.

Contacts 214 couple local IO lines (e.g., LIO1, LIO1') to the sensing circuits 212 associated with a given column. The local IO lines are further coupled to a global IO select circuit 216 associated with that column, wherein the global IO select circuit 216 may also be referred to as an LMUX circuit. In one embodiment, the top and bottom blocks 202 have common global IO lines as shown in the FIG. 2B. In other embodiment the top and the bottom blocks could have separate global IO lines, and the local IO lines span the sections within each block In still other embodiments, the columns of each segment within in each section could have a selection circuit associated therewith (e.g., in FIG. 2A, there could be seven rows of selections circuits associated with both the top and bottom blocks).

The global IO select circuits 216 selectively couple the local IO lines (e.g., LIO1, LIO1') to global IO lines (e.g., GIO1, GIO1'). The global IO lines can be coupled to output buffers or other devices, which can, for example transfer data to and from the memory device relative to another external circuit. In the illustrated embodiment, each global IO line can be coupled to a common column in each and every segment. For example, local IO lines LIO1/LIO1' from the six 32K segments in the top block 202 can be selectively coupled to global IO lines GIO1/GIO1', and local IO lines LIO64/ LIO64' can similarly be coupled to the global IO lines GIO64/ GIO64'.

Figure 2C:
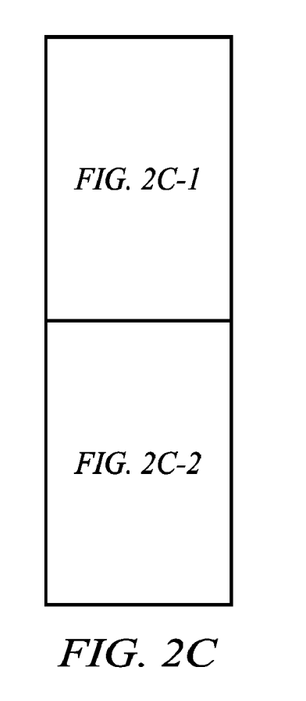
Figure 2C:
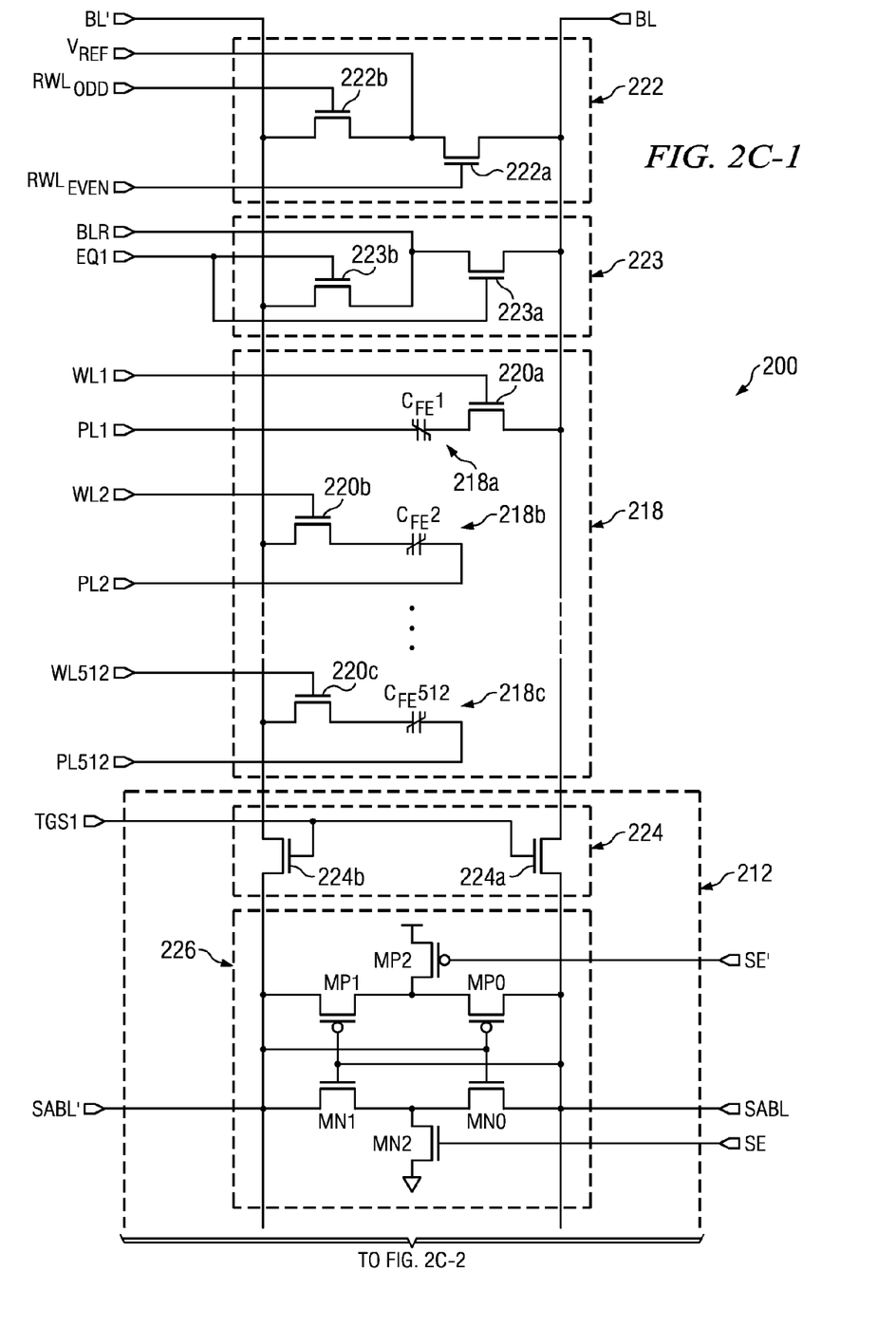
Figure 2C:
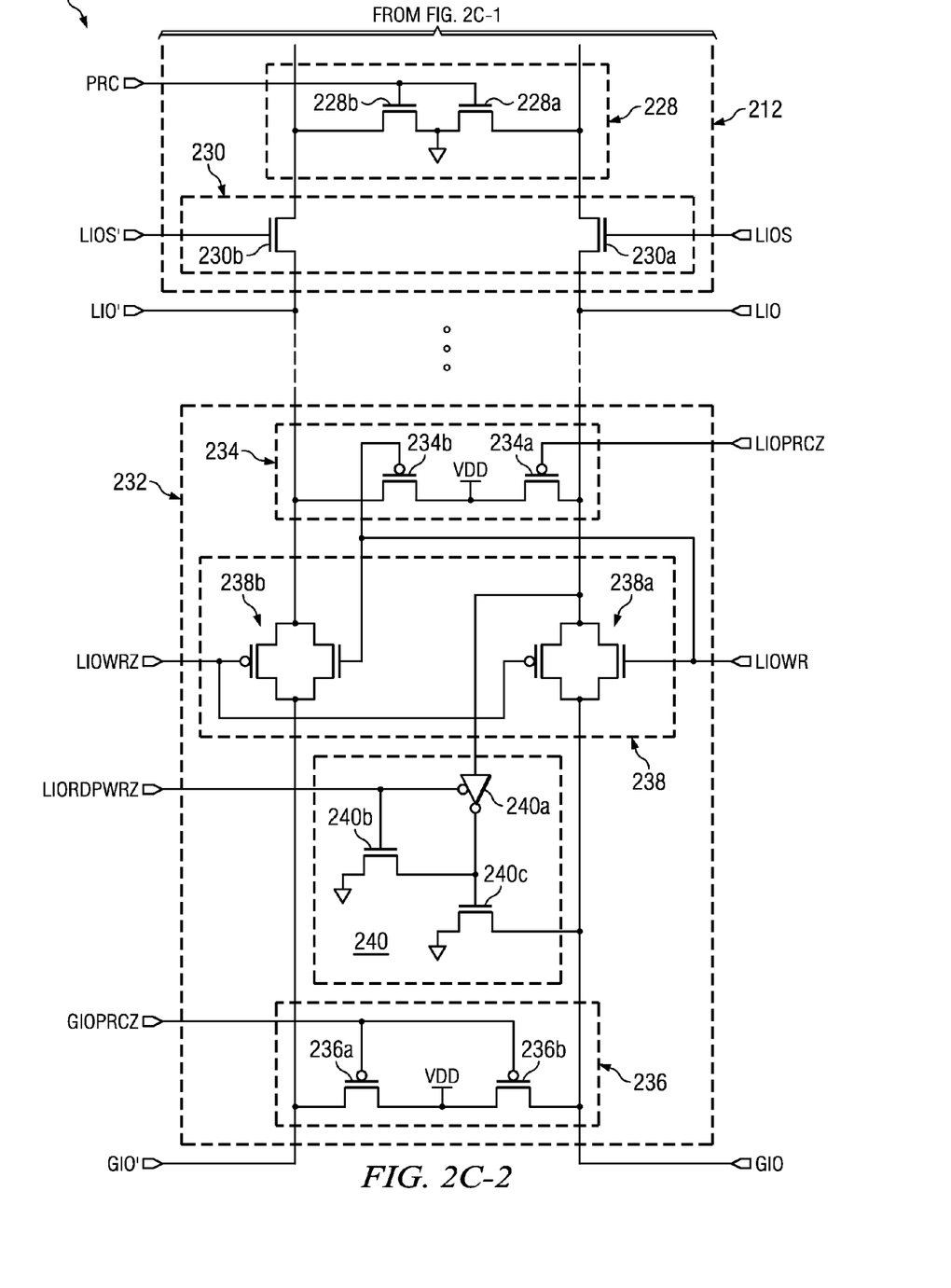

Referring now to FIG. 2C, one circuit schematic showing one column of FIG. 2B is illustrated, wherein only a single sensing circuit 212 is shown for purposes of brevity and clarity. The column includes memory cells 218a-218c that are accessed during read, restore, and write operations via the bitlines BL and BL' using wordline and plateline signals WL1-WL512 and PL1-PL512, respectively, wherein the wordlines enable transistors 220a-220c thereby allowing access to the associated memory cells. The FE capacitors in odd numbered data words, such as $C_{FE}1$ may be connected to the bitline BL via WL1 and PL1, and the FE capacitors in even numbered data words, such as $C_{FE}2$ may be connected to the bitline BL' via WL2 and PL2.

While one data cell bitline is accessed (e.g., BL1'), a reference voltage generator 222 applies a reference voltage $V_{REF}$ to the other data cell column bitline (e.g., BL1) by using a transistor 222a or 222b via reference wordline signals $RWL_{ODD}$ or $RWL_{EVEN}$. The bitlines BL and BL' are pre-charged or equalized during various memory access operations to a bitline reference voltage BLR, such as VSS or ground, via a bitline equalization circuit 223 using transistors 223a and 223b according to a signal EQ1.

A sensing circuit 212 is coupled to the cell bitlines, wherein the sensing circuit 212 facilitates transferring data between the memory cell bitlines BL'/BL and the local IO lines LIO'/ LIO. More specifically, the memory cell bitlines BL/BL' and sense amp bitline pairs SABL/SABL' are coupled to one another via transistors 224a and 224b, respectively, of a sense amp connect circuit 224 using a signal TGS1. A cross-coupled latch sense amp 226 comprises sense amp bitlines or terminals SABL and SABL', and is enabled using sense amp enable signals SE and SE'. Although illustrated and described herein using the exemplary cross-coupled sense amp 226, the invention finds utility in association with any type of sense amp. During read and write operations, the sense amp bitlines SABL and SABL' are precharged to VSS via transistors 228a and 228b of a sense amp precharge circuit 228, which are controlled with a signal PRC. The sense amp bitline terminals SABL and SABL' are coupled to local IO bitlines LIO and LIO', respectively, via transistors 230a and 230b of local IO select circuit 230.

A global IO select circuit 232 is coupled to the local IO lines and can selectively couple the local IO lines LIO/LIO' to global IO lines GIO/GIO' to thereby transfer data between the local IO lines and the global IO lines. The global IO select circuit 232 can be configured to selectively bias adjacent local IO lines during a read operation to act as a shield thereby reducing data signal degradation. For example, during a read operation, the global IO select circuit 232 can be configured to inactivate one local IO line (LIO'), and to provide data on the other local IO line (LIO). During a write operation, the global IO select circuit 232 can be configured to provide data on one local IO line while providing complimentary data on the complimentary local IO line. During the write operation, this data and complimentary data on local IO (LIO) lines can be transferred from a global IO line and or complimentary global IO line, respectively. Although FIG. 2C shows a pair of GIO lines associated with each column, it is not necessary to have complimentary GIO lines. For example, a single GIO line can be used to transfer data to a pair of complimentary LIO lines while writing and a single GIO line can receive the data from a LIO line to transfer it to the other circuits. In another embodiment, separate signals GIOPRCZ and GIO-PRCZ' (not shown) can be applied to the gates of the transistors 236b and 236a, respectively which could allow GIO' to be biased at VDD and act as shield between the GIO lines when the data is transferred from the LIO lines to the GIO lines.

In one embodiment, the global IO select circuit 232 includes a local pre-charge circuit 234 comprising p-channel transistors 234a and 234b, wherein transistor 234a is controlled by signal LIOPRCZ and transistor 234b is controlled by signal LIOWR. During a read access, the local pre-charge circuit 234 pre-charges local IO lines LIO/LIO' to VDD, after which the signal LIOPRCZ is de-asserted and the signal LIOS is asserted to couple the local IO line LIO to the sense amp bit lines SABL via the transistor 230a. Because the signal LIOS' is not activated, the SABL' is not coupled to the LIO'. The LIO' is held at VDD since the LIOWR (LIO write enable) is low during a read access. In addition, the illustrated global IO circuit 232 includes a global pre-charge circuit 236 comprising p-channel transistors 236a and 236b, wherein the transistors 236a and 236b are controlled by signal GIOPRCZ.

The illustrated global IO select circuit 232 further includes a first coupling circuit 238 that facilitates selective coupling of the local IO lines to the global IO lines. During write memory operations, the first coupling circuit can transfer data between the local and global IO lines, for example, by a pair of CMOS transfer gates 238a and 238b, each of which comprises a PMOS transistor in parallel with an NMOS transistor that are controlled by signals LIOWRZ and LIOWR. Thus, during write memory operations, the first coupling circuit 238 can transfer complimentary data from the complimentary Global IO line GIO' to the complimentary Local bit line LIO' while simultaneously transferring data from the Global IO line GIO to the Local IO line LIO.

Figure 2D:
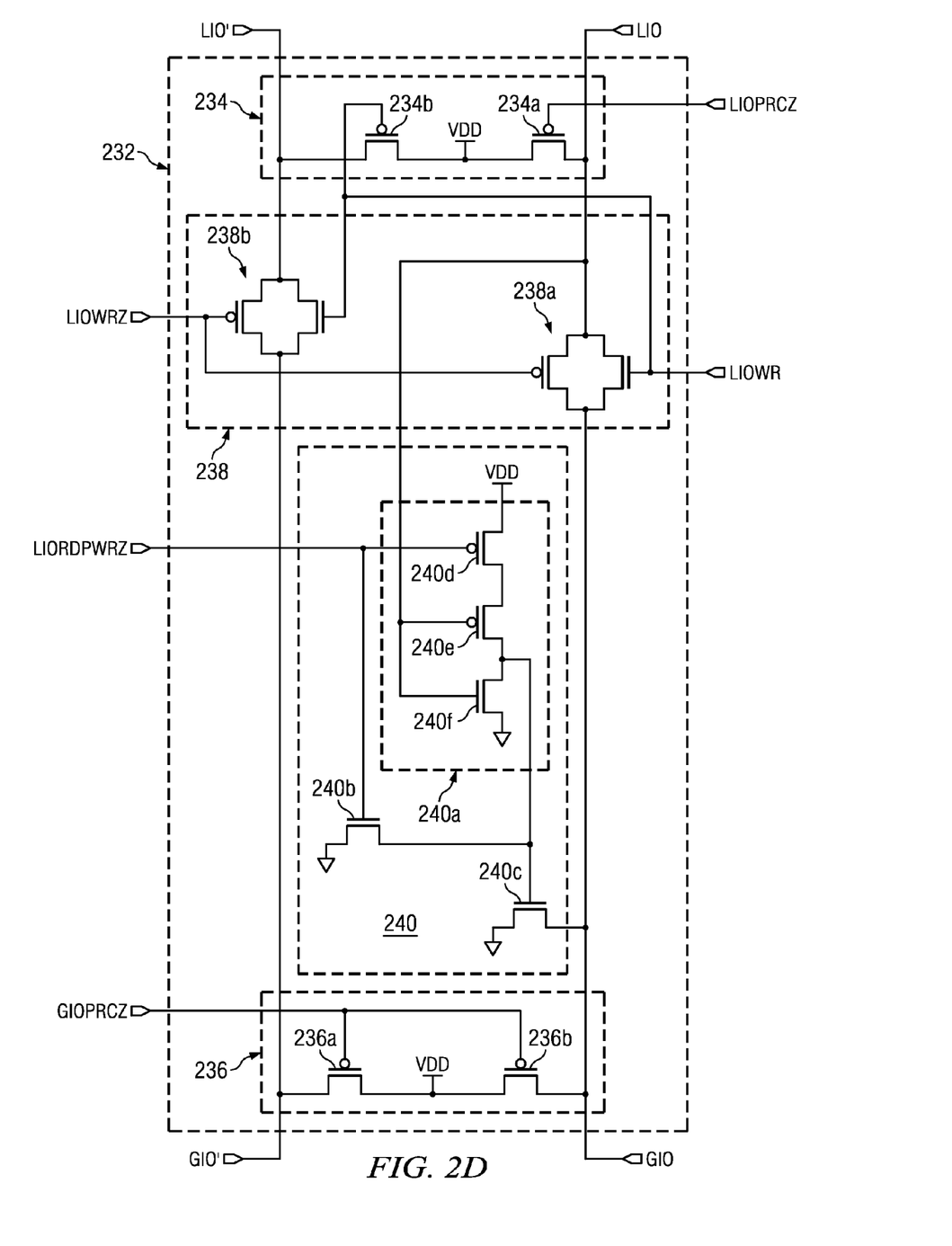

During read operations, a transfer circuit 240 transfers data from one local IO line (e.g., LIO) to its associated global IO line (e.g., GIO), while the first coupling circuit 238 is disabled. In the illustrated embodiment, the transfer circuit 240 includes a switched power inverter 240a and an n-channel transistor 240b that are controlled by signal LIORDPWRZ, wherein the output signal of the switched power inverter is coupled to the gate of another n-channel transistor 240c. FIG. 2D shows a more detailed schematic in which the switched power inverter 240a comprises a pair of p-channel MOSFETS 240d, 240e and an n-channel MOSFET 240f in series.

Figure 2E:
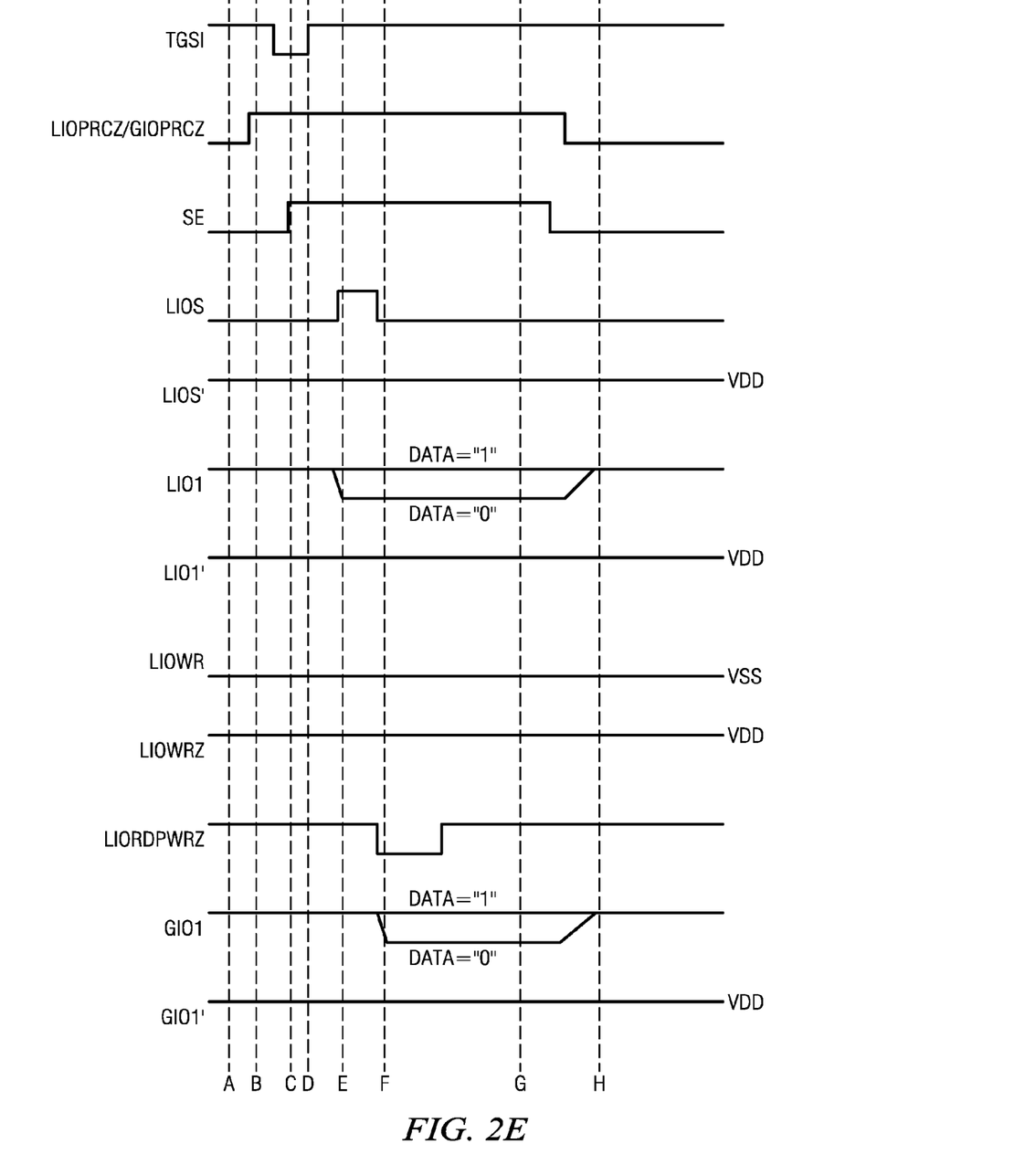
Figure 2F:
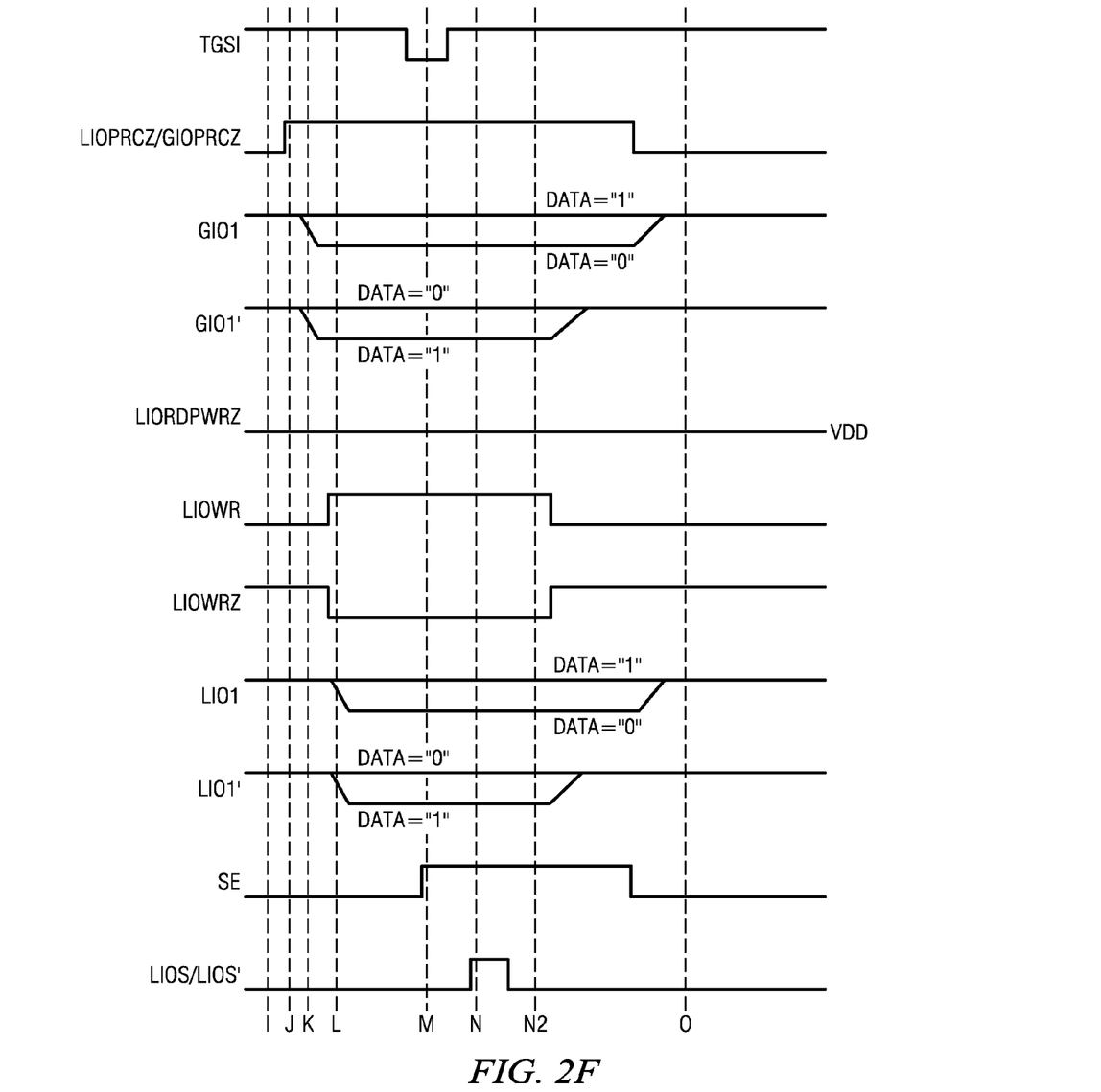

Referring now to FIGS. 2E-2F, the functionality of the memory device 200 of FIG. 2C is discussed with respect to illustrative timing diagrams. As discussed further herein, FIG. 2E relates to an illustrative read operation and FIG. 2F relates to an illustrative write operation.

As shown in the read operation of FIG. 2E, at point "A" the LIOPRCZ and GIOPRCZ ("pre-charge" signals) are low, thereby enabling the p-channel transistors of the local IO pre-charge circuit 234 and global IO pre-charge circuit 236. Thus, the local IO lines (LIO, LIO') and global IO lines (GIO, GIO') are driven to a high voltage.

At point "B" the LIOPRCZ and GIOPRCZ signals transition to a high voltage, thereby disabling the p-channel transistors 234a, 236a, 236b.

At point "A the TGS1 signal is asserted, and the bitlines BL/BL' are coupled to SABL/SABL' by the circuit 224. Transfer of the signal from the data cell to the BL and the reference voltage to BL' were accomplished prior to the point "B" but not shown. At point "C" the TGS1 is de-asserted to decouple the BL/BL' from SABL/SABL' and the signal SE/SE' are asserted to enable the sense-amp to differentiate the signal on SABL/SABL' and latch it. However, the sense-amp, the local IO lines LIO/LIO', and the global IO lines are all electrically isolated from one another. This electrical isolation occurs because transistors associated with local IO select circuit 230, first coupling circuit 238, and transfer circuit 240 are disabled. Because of the pre-charging, at least the local IO lines LIO/LIO' and global IO lines GIO/GIO' have electrical charged stored thereon, and are thus shown as having a high voltage at this point. At point "D" the TGS1 is asserted again.

At point "E", the LIOS signal transitions to a high voltage, enabling transistor 230a of the local IO select circuit 230 and thereby coupling the sense amp terminal SABL to the local IO line LIO. In the exemplary device in order to save power the transistor 230b is not activated so that it will be not draw any current from LIO' which is coupled to VDD. Thus, charge is transferred from the sense amp terminals to the local IO lines. As illustrated, the voltage on LIO can represent either a "1" or a "0" data value, depending on the value that was stored in the memory cell (and which is latched at the SABL node). While LIO has a data value of either "0" or "1", a high voltage of approximately VDD is applied to LIO' throughout the memory access. This high voltage occurs on LIO' because the LIOWR signal is held low during the read operation, which enables p-channel transistor 234b, thereby coupling LIO' to VDD throughout the read operation.

At point "F", the LIORDPWRZ signal transitions low, enabling the transfer circuit 240 and selectively passing the data from LIO to GIO. Thus, during a read operation, the first coupling circuit 238 remains disabled, and does not couple the local IO lines to the global IO lines. At point G the LIORDPWRZ signal transitions high to disable the switched power inverter and transistor 240c. Meanwhile, the transferred data on the GIO is captured by another circuit (not shown). At point "H", the LIOPRCZ and GIOPRCZ signals have been driven low, and the local IO lines and global IO lines have been pre-charged for another memory access.

As shown in the write operation of FIG. 2F, at point "I" the LIOPRCZ and GIOPRCZ ("pre-charge" signals) are low, again thereby enabling the p-channel transistors of the local IO pre-charge circuit 234 and global IO pre-charge circuit 236 and providing a high voltage on the local IO lines (LIO, LIO1') and global IO lines (GIO, GIO').

At point "J" the LIOPRCZ and GIOPRCZ signals transition to a high voltage, thereby disabling the p-channel transistors 234a, 236a, 236b. At this point the bitlines BL/BL', the local IO lines LIO/LIO', and the global IO lines are all electrically isolated from one another.

At point "K", data is provided onto the global IO lines to be written into the memory cell.

At point "L", the LIOWR and LIOWRZ signals transition to a high voltage and low voltage, respectively. These transitions disable the p-ch transistor 234b and couple the local IO lines to the global IO lines via the first coupling circuit 238, for example via the pass transistors 238a and 238b. Thus, at point "L", charge passes from the global IO lines to the local IO lines, causing a voltage to develop on the local IO lines.

In the exemplary device in the write cycle the bit cells are interrogated and voltage developed on the bitlines similar to a read cycle. At point "M" the SE signal transitions to a high voltage and SE' signal transitions to low voltage. The sense-amp read the signal on the bitlines. However, the read signal in the sense-amp is overwritten by the new data as explained below.

At point "N", the LIOS and LIOS' signals are asserted, enabling transistors 230a, 230b of the local IO select circuit 230 and thereby coupling the sense amp terminals SABL/SABL' to the local IO lines LIO/LIO', respectively. The n-ch 230a and 230b transistors typically allow only VDD-Vt to pass for high side and 0V for low side from LIO/LIO' to SABL/SABL'. However, the re-generative nature of the latch sense-amp pulls the SABL/SABL' node to VDD and 0V. The LIOS and LIOS' are disabled at point N2 The TGS1 signal which is already asserted at this time, allows the 224 coupling circuit to couple the sense-amp terminals to a selected memory cell via the bitlines. Since the n-ch 224 transistors can pass only VDD-Vt (assuming the ON gate voltage of TGS1 is VDD) from the sense-amp terminals (SABL/SABL') to the bitlines, a p-ch pull up circuit (not shown) coupled to the bitlines may be used to boost the bitline voltage to full VDD.

Lastly, at point "O", the LIOPRCZ and GIOPRCZ signals have been driven low, and the local IO lines and global IO lines have been pre-charged for another memory access.

In the exemplary device complimentary data is applied to the complimentary GIO lines during write cycle. However, in another embodiment, only single GIO line per data path could be used. The data could be switched to complimentary form at the GIO to LIO interface. For example if the data is 1 at a GIO line then the data impressed (circuit not shown) on LIO would be 1 and on LIO' it would be 0. Similarly if the data on the GIO line is 0, then the data impressed on LIO would be 0 and on the LIO' it would be 1.

In another embodiment the signal LIOS' could also be asserted during read cycle along with the signal LIOS. This may cause the some current to flow from the LIO' to the sense-amp but would eliminate the need for the LIOS' signal.

Yet in another embodiment the pre-charge circuit coupled to the LIO' could also be de-asserted during the read operation similar to that for the LIO and the signal that is developed on LIO' is discarded and the signal that is developed on the LIO is used to transfer the data on to the global IO line or global IO lines, irrespective of the state of the signal LIOS' when the LIOS is asserted during the read.

In the exemplary device 1T1C cell configuration is described. However, the invention is also applicable to a 2T2C configuration.

Figure 3:
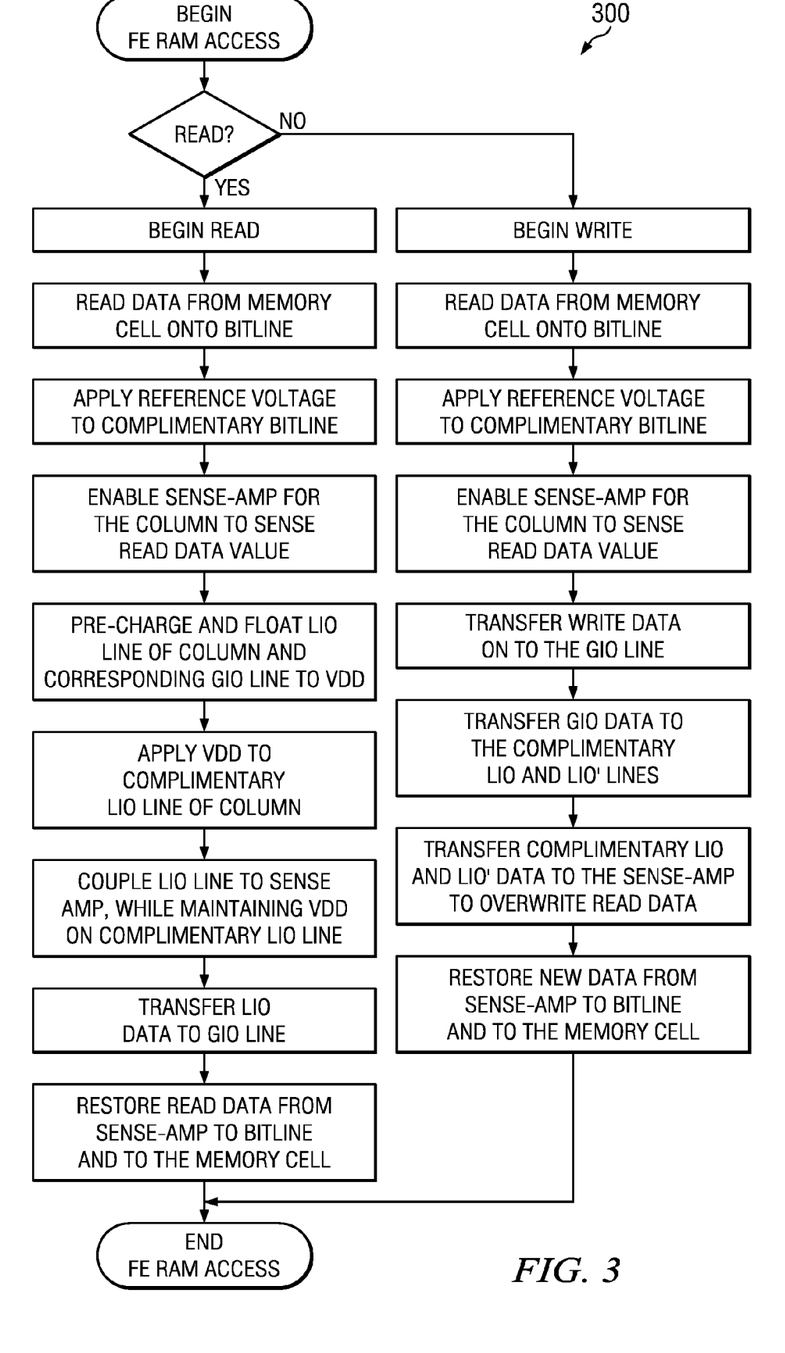
FIG. 3 is flow chart relating to aspects of a method for performing memory operations in one memory device.

FIG. 3 shows a flow chart for one method 300 that relates to various embodiments of the present invention. Notably, while the methods illustrated herein are illustrated and described as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the operation of memory device which are illustrated and described herein (e.g., memory device 200 in FIG. 2) as well as in association with other systems not illustrated, wherein all such implementations are contemplated as falling within the scope of the present invention and the appended claims.

In one embodiment, the local IO lines and global IO lines may be fabricated in horizontally parallel metal layers separated by a dielectric layer, wherein the local IO lines and global IO lines run perpendicular to one another within the parallel metal layers. For example, the local IO lines could reside in a metal 4 layer and the global IO lines could reside in a metal 5 layer. Further, although the illustrated embodiments have been described with respect to n-channel or p-channel devices, it will be appreciated that the types of devices could suitable interchanged.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A method for accessing a memory cell in a memory device via a local IO line and a complimentary local IO line that are associated with the memory cell, comprising:

reading a data value from the memory cell by developing on the local IO line using a sense amp a voltage indicative of the data value while applying an approximately constant voltage that is independent of the data value to the complimentary local IO line; and writing another data value to the memory cell by applying a voltage on the local IO line and concurrently applying a complimentary voltage on the complimentary local IO line;

wherein during the act of reading, the sense amp transfers the data value on the local IO line by coupling the sense amp to the local IO line while the complimentary local IO line is decoupled from the sense amp.

2. The method of claim 1, wherein the memory device is a ferro-electric memory.

3. A sensing system for a memory device, comprising:

a sensing circuit associated with a pair of complimentary local IO lines and a memory cell, wherein the sensing circuit comprises a local IO select circuit that facilitates data transfer between the pair of complimentary local IO lines and the memory cell; and a global IO select circuit coupled to the pair of complimentary local IO lines and at least one global IO line, the global IO select circuit operable to selectively transfer data from the at least one global IO line to the complimentary local IO lines;

wherein the sensing system is configured to selectively inactivate one of the pair of complimentary local IO lines during a read operation.

4. The system of claim 3, wherein inactivating one of the pair of complimentary local IO lines comprises holding the one of the complimentary local IO lines at a constant voltage during the transfer of data between the one of the complimentary local IO lines and a corresponding global IO line.

5. The system of claim 4, wherein inactivating one of the pair of complimentary local IO lines comprises discarding any signal on the one of the complimentary local IO lines during the transfer of data between the one of the complimentary local IO lines and a corresponding global IO line.

6. The system of claim 3, wherein the memory device is a ferro-electric memory.

7. The system of claim 3, further comprising:

a sense amp connection circuit coupled to the memory cell and the sensing circuit, the sense amp connection circuit configured to selectively couple the sensing circuit to the memory cell.

8. The system of claim 3, wherein the global IO select circuit is coupled to more than one sensing circuit via the one of the complimentary local IO lines.

* * * * *